United States Patent
Gao (10) Patent No.: US 11,638,365 B2
(45) Date of Patent: Apr. 25, 2023

(54) HYBRID DATA CENTER RACK

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/987,339

(22) Filed: Aug. 6, 2020

(65) Prior Publication Data

US 2022/0046822 A1 Feb. 10, 2022

(51) Int. Cl.
*H05K 7/20* (2006.01)
*H05K 7/14* (2006.01)
*H05K 5/03* (2006.01)

(52) U.S. Cl.
CPC .......... *H05K 7/20272* (2013.01); *H05K 5/03* (2013.01); *H05K 7/1488* (2013.01); *H05K 7/20172* (2013.01); *H05K 7/20736* (2013.01); *H05K 7/20781* (2013.01)

(58) Field of Classification Search
None
See application file for complete search history.

(56) References Cited

U.S. PATENT DOCUMENTS

| | | | | |
|---|---|---|---|---|
| 7,450,385 | B1 * | 11/2008 | Campbell | H05K 7/20781 361/689 |
| 8,250,877 | B2 * | 8/2012 | Correa | H05K 7/20781 62/440 |
| 8,964,375 | B2 * | 2/2015 | Claassen | H05K 7/20736 361/679.5 |
| 9,025,331 | B2 * | 5/2015 | Campbell | F28D 15/00 361/679.53 |
| 9,132,519 | B2 * | 9/2015 | Chainer | H05K 7/20781 |
| 10,779,441 | B2 * | 9/2020 | Martini | H05K 7/20172 |
| 2011/0232889 | A1 * | 9/2011 | Eckberg | F28D 1/0435 165/200 |
| 2012/0300398 | A1 * | 11/2012 | Eckberg | H05K 7/2079 165/80.2 |
| 2013/0021746 | A1 * | 1/2013 | Campbell | H05K 7/2079 165/104.13 |
| 2021/0153391 | A1 * | 5/2021 | Gao | H05K 7/20327 |
| 2021/0392789 | A1 * | 12/2021 | Gao | H05K 7/1497 |

* cited by examiner

*Primary Examiner* — Courtney L Smith
(74) *Attorney, Agent, or Firm* — Womble Bond Dickinson (US) LLP (57) ABSTRACT

Embodiments are disclosed of an information technology (IT) rack. The IT rack includes an equipment enclosure with a front, a rear, and one or more partitions, each partition adapted to receive one or more pieces of liquid-cooled information technology (IT) equipment. One or more cooling doors are positioned on the back of the equipment enclosure, each having therein a heat exchanger, the heat exchanger that is fluidly coupled to at least one of the one or more pieces of liquid-cooled IT equipment forming liquid cooling loops. Each of the one or more cooling doors is movable between a first position where the cooling door extends across the back of at least one partition so that air from the interior of the at least one partition flows through the cooling door, and a second position where air from outside the equipment enclosure flows through the cooling door. Fans are used in the middle section of rack or between two enclosures for assisting airflow management. Dedicated space for the fans are designed on the rack.

19 Claims, 10 Drawing Sheets

HYBRID DATA CENTER RACK

TECHNICAL FIELD

The disclosed embodiments relate generally to liquid cooling systems for temperature control of electronic equipment and in particular, but not exclusively, to a hybrid data center rack for temperature control in data center equipment.

BACKGROUND

Much modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Much modern IT equipment therefore requires liquid cooling or liquid-air hybrid cooling.

As a result of the requirement for liquid cooling, some pieces of IT equipment have an on-board cooling system that is thermally coupled to individual components that need cooling. But these on-board cooling systems usually do not operate in isolation. They are usually coupled to at least one larger cooling system, such as liquid cooling system in an electronics rack. The rack's cooling system can also be coupled to the liquid cooling system of a larger facility such as a data center. In such a system, the data center's cooling system circulates a working fluid through the rack cooling system, which in turn circulates the working fluid through the cooling system on the piece of IT equipment.

One challenge in designing data centers and data center racks is the mismatch between the lifetime of the data center and the lifetime of IT equipment housed in the data center. The data center and its facilities, electrical systems, cooling systems, etc., change much more slowly that the electronics housed within. Generally, the electronics change quickly and become more customized including their form factors, packaging method, system design, mechanical/thermal (air cooling and liquid cooling)/structural solutions. This rapid change leads to several associated problems. For example, different operating conditions can lead to different rack power in different scenarios. Data center design and corresponding cooling and power source availabilities might not be able to keep up—e.g., some data centers provide only cooling air, which might not be enough considering the rising power and heating, and variations in the cooling design in the IT equipment.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2A shows the cooling door in a first position, while FIG. 2B shows the cooling door in a second position.

FIG. 3A shows the cooling doors in a first position, while FIG. 3B shows the cooling doors in a second position.

DETAILED DESCRIPTION

Embodiments are described of IT racks having one or more cooling doors. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The disclosed embodiments of IT racks provide high resilience and compatible hardware platforms for deploying different types of servers in different data center environments. In the described racks, one or more sections of cooling doors equipped with heat exchanger coils are attached to the rear side of the rack. The cooling doors can be operated in either first (closed) position (extending across the rear side of the rack) or in a second (open) position for expanding the cooling capabilities. Fan units for moving cooling airflow can be used in the middle sections of the rack or integrated between two adjacent racks. If a fan unit is used in a single rack, the rack can have a dedicated fan section to house the fan unit. Containment solutions are used in arranging the racks, and several system layouts for a data center containment and the rack architectures are described.

Features of this advanced hybrid rack configuration and design include:

Rear door heat exchanger for extending heat spreading.
Optional integrated fan unit for airflow management.
Cooling adjustment for non-uniform server power population.
Support for operating and cooling in both air-cooled data centers and liquid-cooled data centers, as well as air cooled IT equipment and liquid cooled IT equipment.
Enabling different data center system level integrate designs.
Expanding the role of an IT rack beyond performing as a cabinet. The rack can be a solution for deploying different types of servers in different type of data centers, at the same time, supporting for different type of cooling requirements and providing elastic cooling capacity expanding capability.

Figure 1:
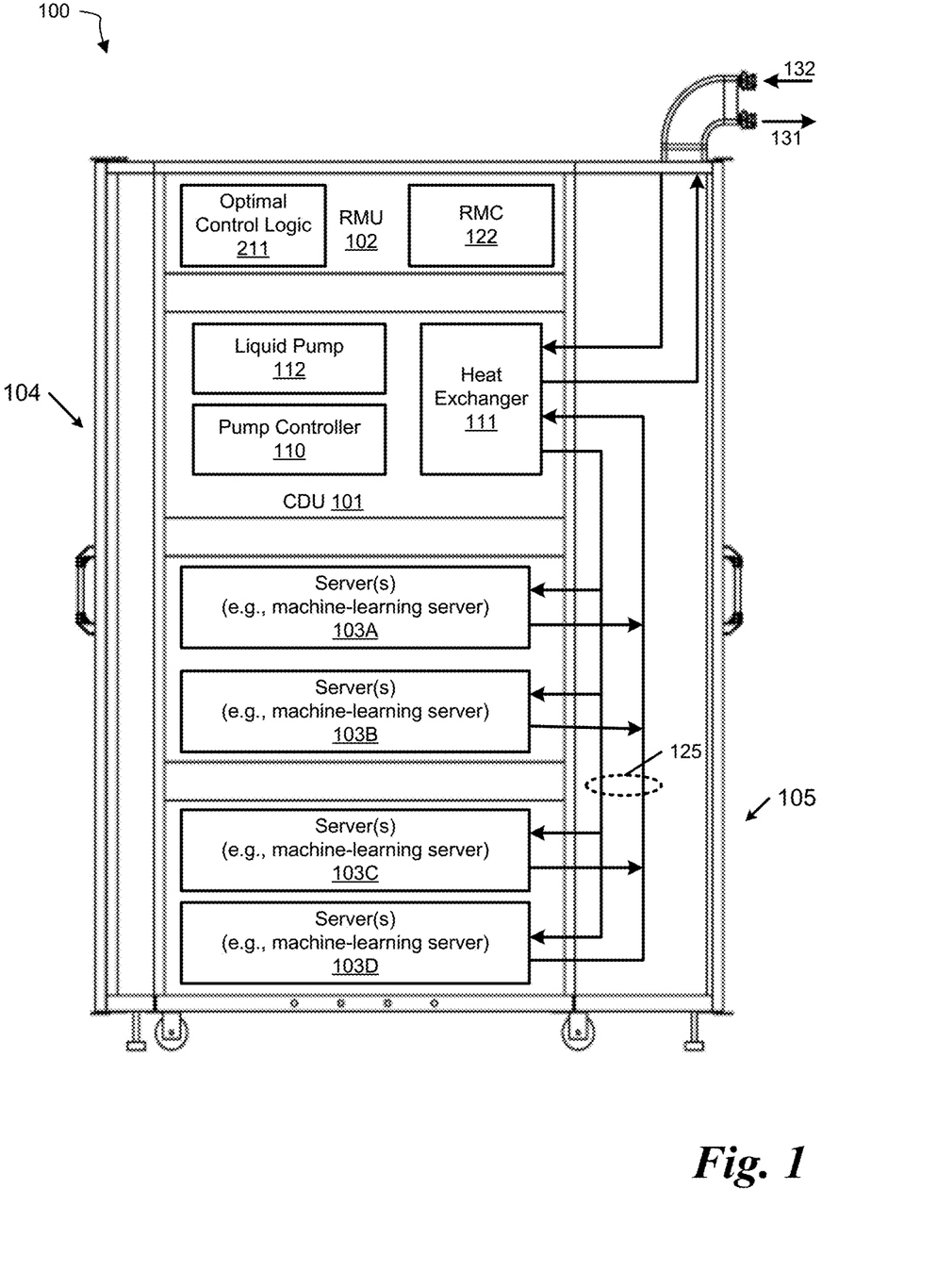
FIG. 1 is a block diagram of an embodiment of an electronic rack with electronics and cooling systems housed within.

FIG. 1 is a block diagram illustrating a side view of an embodiment of an electronic rack. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Supply/return lines 131-132 can be fluidly coupled to a cooling door (see FIG. 2A et seq.), to data center liquid cooling system, or to both.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.,) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2A:
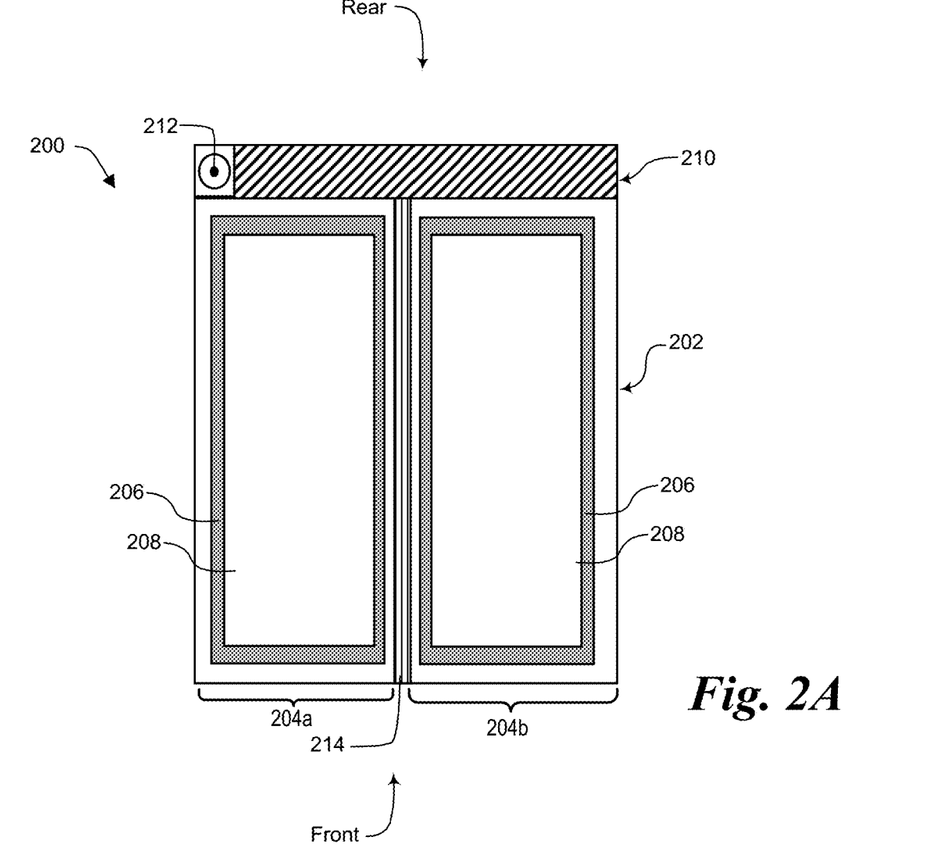
FIGS. 2A-2B are cross-sectional top views of an embodiment of an information technology (IT) rack including a cooling door.
Figure 2B:
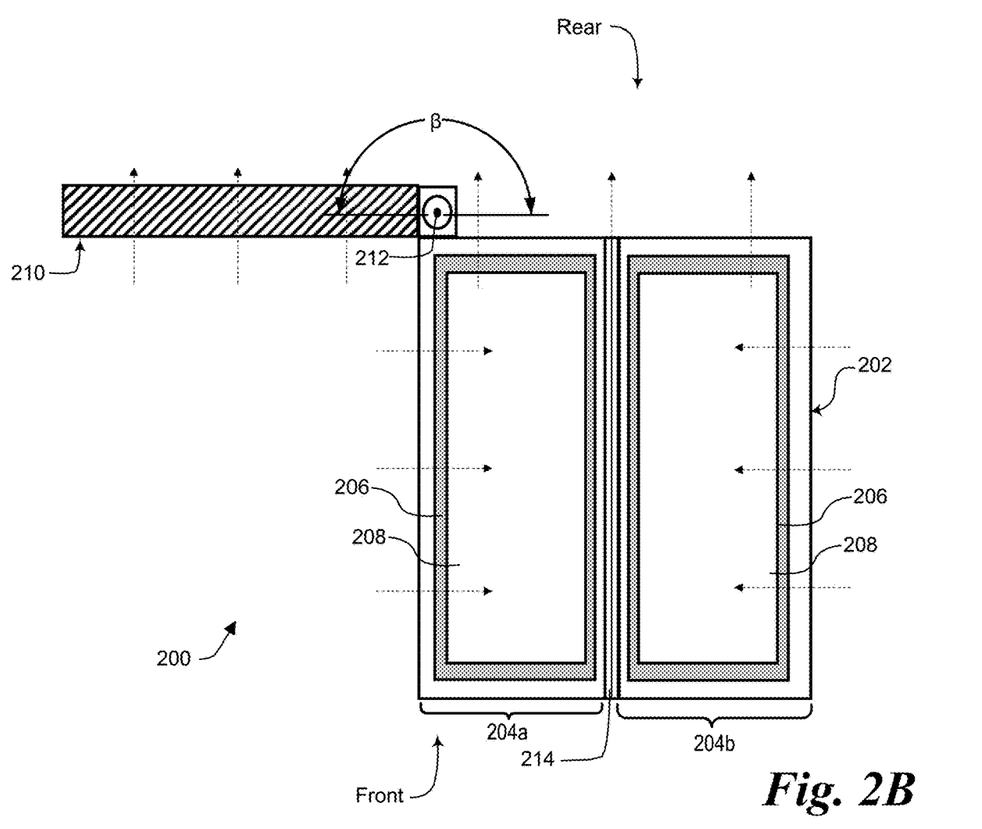
Figure 2C:
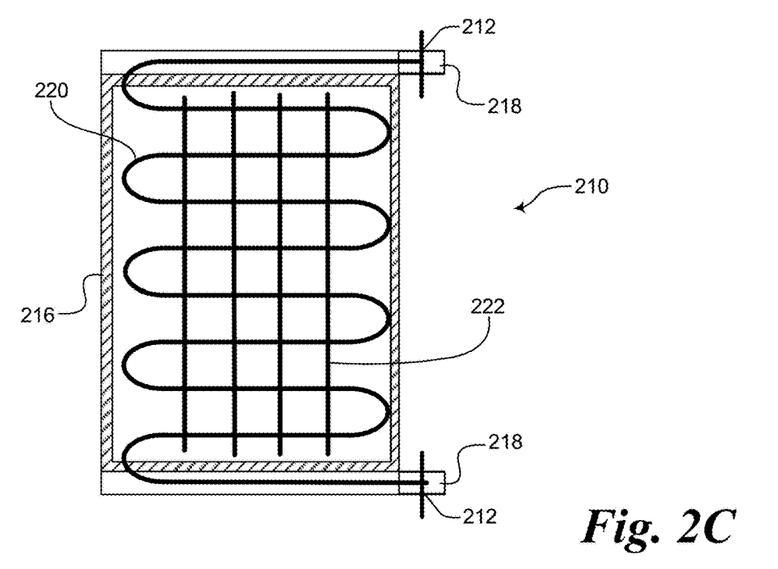
FIG. 2C is a side view of an embodiment of a cooling door.

FIGS. 2A-2C together illustrate an embodiment of an information technology (IT) rack 200. FIGS. 2A-2B are top cross-sections of the rack. IT rack 200 has a front and a rear and includes an equipment enclosure 202 divided into one or more vertically-oriented partitions 204. This means the rack can not only be arranged in U space along the height, it also divided into several regions across its width direction. In the illustrated embodiment, equipment enclosure 202 can be a standard IT rack that has been divided into two partitions 204a and 204b, but in other embodiments the equipment enclosure need not be a standard IT rack and can have more or less partitions than shown. Each partition 204 is an IT region adapted to receive one or more pieces of liquid-cooled IT hardware, such as servers, routers, cooling components, and the like, as shown for instance in FIG. 1. Each piece of IT hardware can, for example, include a chassis 206 within which are housed electronics and liquid cooling components 208. The server chassis and fan can be populated to the rack at its dedicated space from the front side of the rack.

A cooling door 210 is coupled to enclosure 202 by one or more hinges 212 positioned on the rear of the enclosure. Cooling door 210 has a heat exchanger therein that is fluidly coupled to the liquid-cooled IT hardware positioned in partitions 204a and 204b, forming a loop with the liquid cooling components 208. The heat exchanger rotates together with the door. Cooling door 210 can rotate about hinges 212 from a first position extending cross the rear of the enclosure to a second position where the cooling door is at a non-zero angle β relative to its first position (see FIG. 2B). Put differently, cooling door 210 is in its first position when β=0 and is in its second position when β≠0. The cooling door's first position can also be described as "closed" and its second position as "open." In the illustrated embodiment, in the open position angle β is substantially 180 degrees, but in other embodiments angle β can be any angle between zero degrees and 270 degrees. Other embodiments of rack 200 can have cooling doors that move between their first and second positions other than by rotation about a hinge (see, e.g., FIGS. 5A-5B). In addition, if the cooling door is connected to a cooling source such as an external cooling loop, the external fluid supply and return can be coupled at the hinge or near the location of the hinge. An embodiment of a cooling door 210 is described below in connection with FIG. 2C.

In the illustrated embodiment a fan unit 214 is positioned in a fan region between partitions 204a and 204b. In embodiments with more than two partitions, a fan unit can be placed between each pair of partitions. In the illustrated embodiment fan unit 214 pulls in or entrains air from the sides of rack 202 and exhausts it out the rear of the enclosure (see FIG. 2B). In one embodiment, fan unit 214 can include one or more radial fans that guide airflow to cover as much area as possible in each partition before leaving the rack. In one embodiment, each partition can be equipped with individual fan/fans for airflow management. The fan unit is an option and can be used in certain high density application scenarios, performance and airflow management optimization, and so on. Other embodiments can omit the fan unit between any pair of partitions, and embodiments that omit the fan unit can also omit the fan region in which the fan unit is installed.

FIG. 2B shows rack 200 in an operating mode, in which cooling door 210 is in its second (open) position, with β set to 180 degrees. Airflow is also shown in the figure by dashed arrows, which show the air flow paths when the cooling door is used as a closed loop. Airflow through cooling door 210 is supplied by the room cooling air unit of the data center room in which rack 200 is located. One portion of the cooling airflow passes through cooling door, and other portion of airflow passes through both sides of the rack before it exits the rear of the rack. Rack 200 can also operate in other modes. In one operating mode, the cooling door remains closed (β=0), in which case the air flowing through the cooling door and the heat exchanger is primarily air exiting the rear of the equipment enclosure. In another operating mode, the cooling door can be open, but at an angle less than 90 degrees (0≤β≤90), in which case the air flowing through the cooling door may be a mix of facility air and exiting enclosure air. In still another operating mode the cooling door can be open, but at any angle greater than or equal to 90 degrees (β≥90), depending on actual use cases and data center room/IT cluster layout and rack arrangement configurations.

FIG. 2C illustrates an embodiment of a cooling door 210. Cooling door 210 includes a frame 216 which includes two protrusions 218 at the top and bottom of one side. Protrusions 218 include provisions for accommodating hinges 212. A heat exchanger is positioned within frame 216 and can be fluidly coupled to one or more liquid cooling systems of IT equipment within the partitions of the rack to which cooling door 210 is coupled (see FIGS. 2A-2B). In a closed-loop configuration, the heat exchanger can be coupled only to the liquid cooling systems of electronics in the enclosure, thus forming a cooling loop that is self-contained in the rack—that is, a closed cooling loop. In an open-loop configuration, the heat exchanger can, instead or in addition, be coupled to a data center liquid cooling loop (i.e., a cooling loop external to the rack), so that liquid cooling is no longer self-contained within the rack.

In the illustrated embodiment the heat exchanger is a liquid-to-air heat exchanger including a tube 220 thermally coupled to fins 222 to enhance heat transfer from liquid flowing through tube 220 into air flowing over tube 220 and fins 222. In one embodiment, the front and back of the cooling door can be left completely open to allow unimpeded flow of air through the door and the heat exchanger, as illustrated in FIG. 2B. In other embodiments, flow-through elements such as screens can be placed at the front, back, or both front and back, of the cooling door to protect elements within the door while allowing airflow through the door and the heat exchanger. In other embodiments, tube arrangement layouts can be different, such as in a parallel manner.

Hinge 212 does not translate, or translates minimally, during movement of the cooling door from its first position to its second position, so that in the illustrated embodiment, tube 220 of the heat exchanger can be coupled to the liquid cooling systems of IT equipment within the partitions through hinge 212, so that it forms a closed liquid-cooling loop within rack 200. In one embodiment, for instance, enclosure 202 can include a fluid reservoir or manifold (not shown) to which the cooling systems are coupled, and the reservoir, pump or manifold can then be fluidly coupled to the heat exchanger through hinge 212. In another embodiment, cooling door 210 can include a fluid reservoir or manifold (not shown) that can then be coupled to the liquid cooling systems in the rack through the hinge. In other embodiments of cooling door 210, the fluid connections between the heat exchanger and the liquid cooling systems need not be through the hinge. For instance, the fluid connection can be accomplished using flexible hoses fluidly connected directly to the heat exchanger, or through a flexible hose fluidly coupled between a fluid reservoir or a manifold and the heat exchanger. In another embodiment, the heat exchanger in cooling door 210 can be fluidly coupled to an external liquid-cooling loop, for instance a liquid-cooling loop in a data center where the rack is located. Connection to an external liquid-cooling loop can be in addition to, or instead of, the closed-loop connection described above. In another embodiment in a closed loop design, the rack distribution manifold and the hinge may be combined as a one part. Either embodiment forms a different cooling architecture and might require certain additional equipment, but the configuration of rack 200 itself is compatible with these applications scenarios without any modification.

Figure 3A:
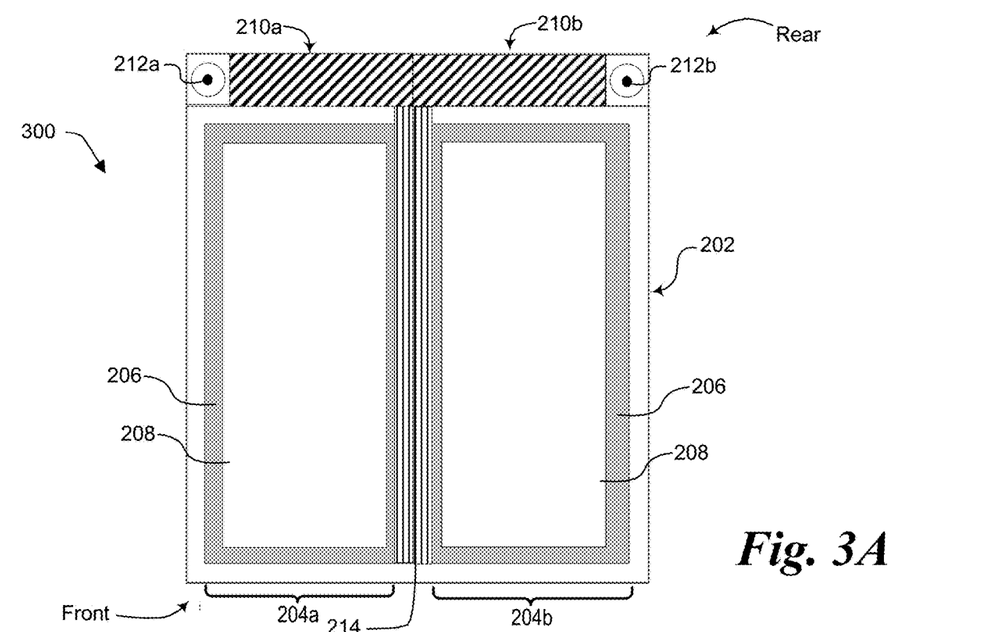
FIGS. 3A-3B are cross-sectional top views of another embodiment of an IT rack including multiple cooling doors.
Figure 3B:
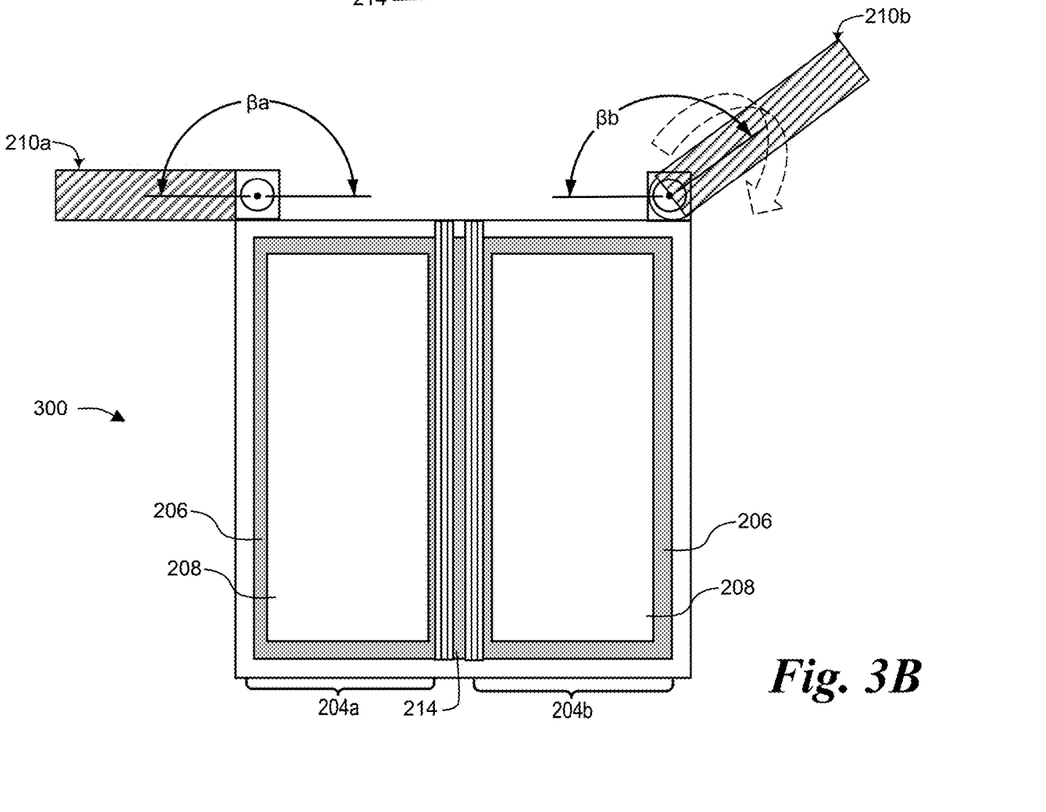

FIGS. 3A-3B together illustrate another embodiment of an IT rack 300. FIG. 3A shows rack 300 with cooling doors in their first position, FIG. 3B shows the cooling doors in their second position. IT rack 300 is in most respects similar to IT rack 200: it has a front and a rear and includes an equipment enclosure 202 divided into vertically-oriented partitions 204a and 204b, but other embodiments can have more or less partitions than shown. Each partition 204 is an IT region adapted to receive one or more pieces of liquid-cooled IT hardware, such as servers, routers, cooling components, and the like, as shown for instance in FIG. 1. Each piece of IT hardware can, for example, include a chassis 206 within which are housed electronics and liquid cooling components 208. In one embodiment a fan region with a fan unit 214 is positioned in a fan region between partitions 204a and 204b, although other embodiments need not include the fan unit, and embodiments without fan unit 214 need not include a fan region to house the fan unit.

The primary difference between racks 200 and 300 is that rack 300 includes multiple cooling doors 210. In the illustrated embodiment, rack 300 includes two cooling doors 210a and 210b, each of which extends across a single partition when in its first (closed) position. This is in contrast to rack 200, in which a single cooling door extends across multiple partitions when in its first position. In one embodiment, cooling doors 210a and 210b have the construction described above in connection with FIG. 2C, but in other embodiments the can have a different construction than shown and in still other embodiments both cooling doors need not have the same construction. Rack 300 has all the same operational modes as racks 200.

FIG. 3B illustrates rack 300 with cooling doors 210 in a second (open) position. Door 210a rotates about hinge 212a through an angle βa from its first position, shown in FIG.

3A, to its second position. Similarly, cooling door 210b rotates about hinge 212b through an angle βb to its second position. In the illustrated embodiment βa is different than βb (βa≠βb), but in other embodiments βa can be the same as βb (βa=βb). In one embodiment, for instance, βa=βb=180 degrees (see, e.g., FIGS. 6-9), but each of βa and βb can take any value between 0 degrees and 270 degrees. The fan 214 can be a single space in the middle between 204a and 204b as shown in FIG. 3A, or two separate spaces as shown in FIG. 3B.

Figure 4:
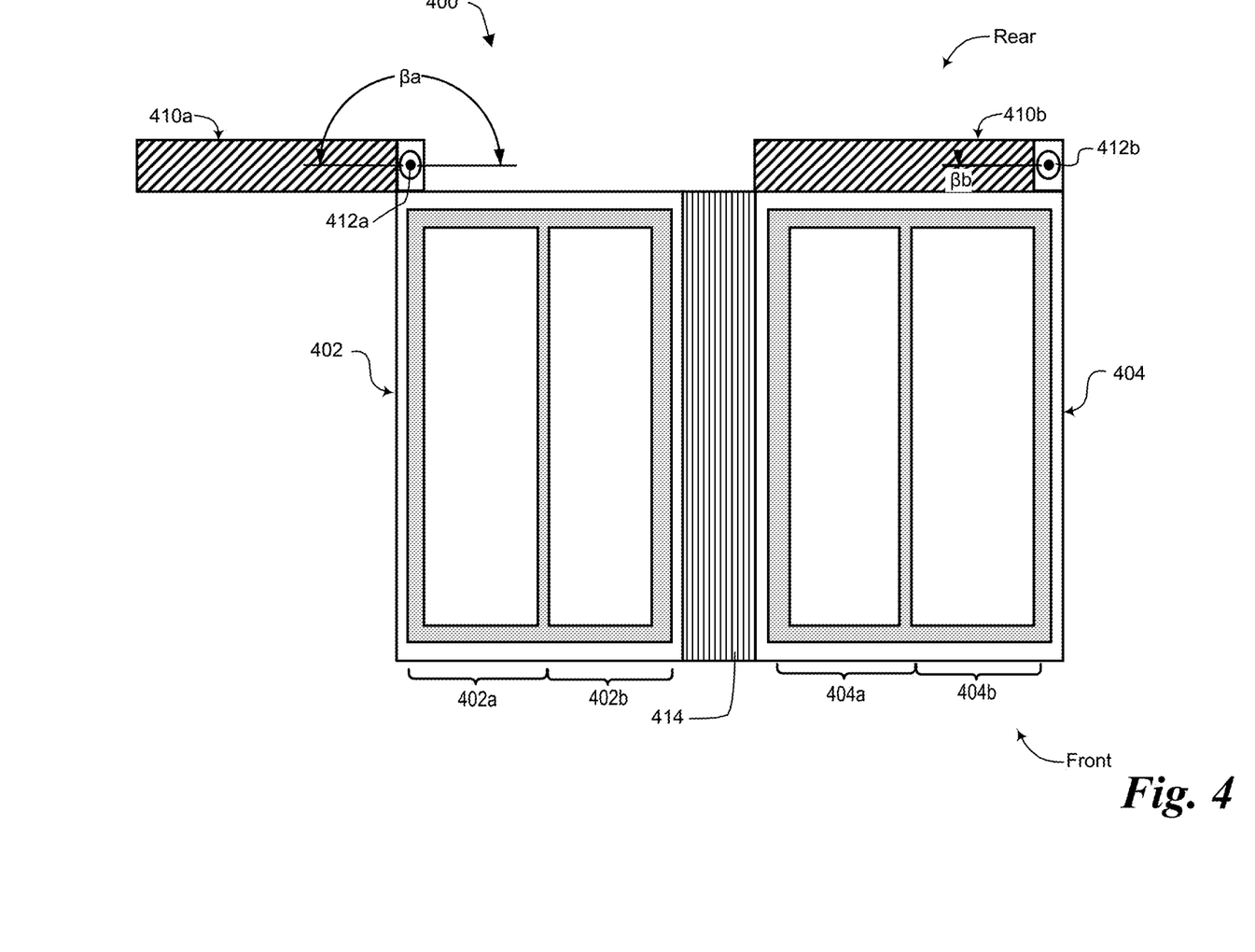
FIG. 4 is a cross-sectional top view of another embodiment of an IT rack including multiple cooling doors.

FIG. 4 illustrates an embodiment of an IT rack 400, which can also be understood as rack system). Rack 400 has a front and a rear and includes two equipment enclosures 402 and 404, each of which is divided into vertically-oriented partitions: enclosure 402 is divided into partitions 204a and 204b and enclosure 404 is divided into partitions 404a and 404b. Other embodiments of rack can have more or less enclosures than shown, each enclosure can have more or less partitions than shown, and each enclosure need not have the same number of partitions. In one embodiment each enclosure 402 and 404 is a standard IT rack, but in other embodiments that need not be the case. A difference between rack 400 and rack 300, then, is that rack 300 is a single enclosure divided into one or more partitions, while rack 400 combines multiple enclosures, each of which can be divided into one or more partitions. As in racks 200 and 300, each partition 402a-402b and 404a-404b is an IT region adapted to receive one or more pieces of liquid-cooled IT hardware, such as servers, routers, cooling components, and the like, as shown for instance in FIG. 1. Each piece of IT hardware can, for example, include a chassis 206 within which are housed electronics and liquid cooling components 208. Rack 400 has all the same operational modes as racks 200 and 300.

A pair of cooling doors 410 are positioned across at least part of the rear of rack 400: cooling door 410a is rotatably coupled to enclosure 402 by hinge 412a and in its first (closed) extends across enclosure 402 and its partitions, while cooling door 410b is rotatably coupled to enclosure 404 by hinge 412b and in its first (closed) position extends across enclosure 404 and its partitions. Cooling doors 410a-410b can rotate about hinges 412 from a first position across the rear of the enclosure to a second (open) position where the cooling door is at a non-zero angle β relative to its first position. Cooling door 410a rotates about hinge 412a through an angle βa from its first position to its second position and cooling door 410b rotates about hinge 412b through an angle βb to its second position. In the illustrated embodiment βa is different than βb (βa≠βb), but in other embodiments pa can be the same as βb (βa=βb) (see, e.g., FIGS. 6-9). In the illustrated embodiment, for instance, βa=180 degrees and βb=0 degrees, but each of βa and βb can take any value between 0 degrees and 270 degrees. Cooling doors 410a and 410b have heat exchangers therein that are fluidly coupled to the liquid-cooled IT hardware positioned in partitions 402a-402b and 404a-404b, and the heat exchanger within the door rotates together with the door. In one embodiment cooling doors 410a and 410b have the construction shown in FIG. 2C.

In the illustrated embodiment a fan unit 414 is positioned in a fan region between enclosures 402 and 404, although in other embodiments there can also be fan units in between partitions within an enclosure, as shown in FIGS. 3A-3B. Other embodiments need not include the fan unit, and embodiments without fan unit 414 need not include a fan region to house the fan unit. In embodiments with more than two enclosures, not every pair of enclosures need have a fan unit between them. In the illustrated embodiment fan unit 414 pulls in air or entrains from the sides of enclosures 402 and 404 and exhausts it out the rear side of the rack. As with IT racks 200 and 300, in some embodiment of rack 400 fan unit 414 can be omitted, and in embodiments that omit the fan unit, the fan region between enclosures 402 and 404 can also be omitted.

Figure 5A:
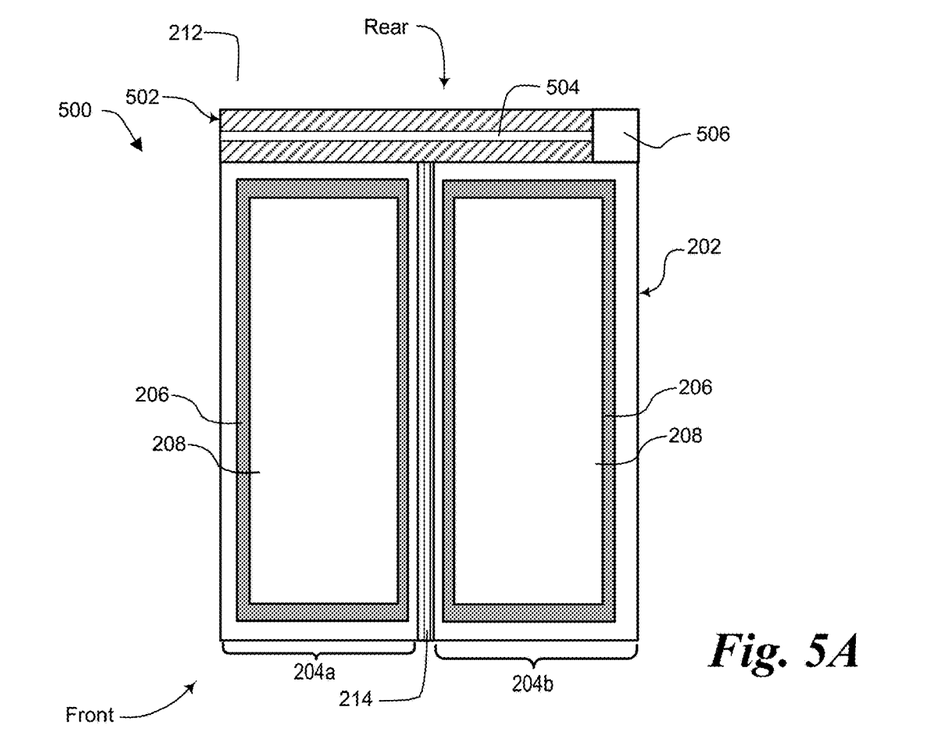
FIGS. 5A-5B are cross-sectional top views of another embodiment of an IT rack including a cooling door.
Figure 5B:
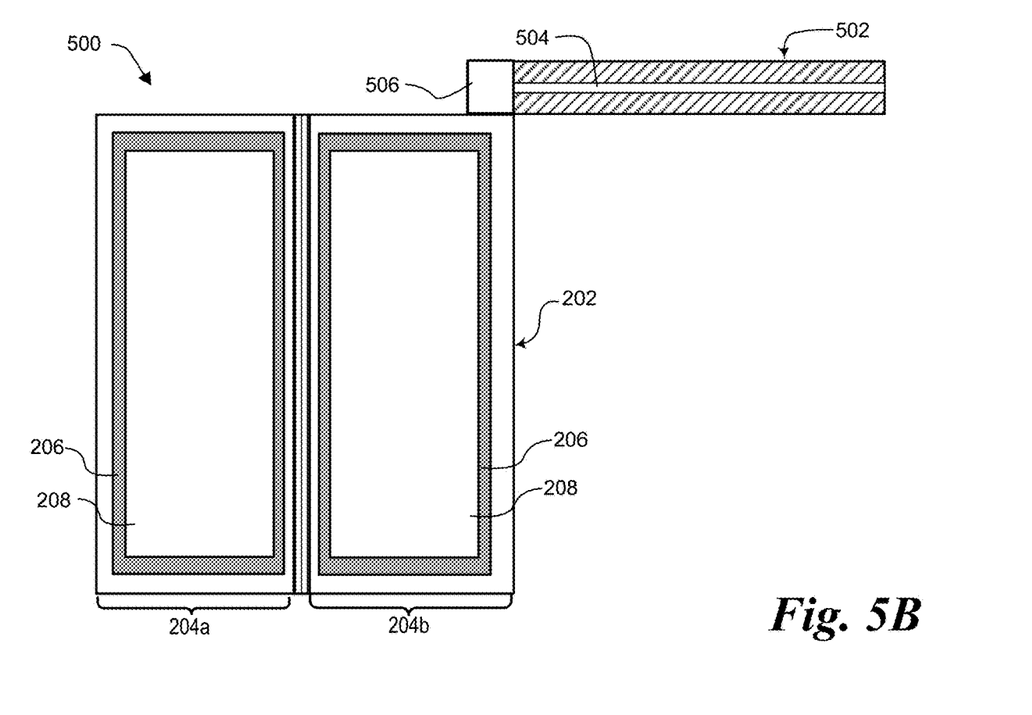

FIGS. 5A-5B illustrate another embodiment of an IT rack 500. IT rack 500 is in most respects similar to IT rack 200 (see FIGS. 2A-2B): it has a front and a rear and includes an equipment enclosure 202 divided into vertically-oriented partitions 204a and 204b, although other embodiments can have more or less partitions than shown. Each partition 204 is an IT region adapted to receive one or more pieces of liquid-cooled IT hardware, such as servers, routers, and the like, as shown for instance in FIG. 1. Each piece of IT hardware can, for example, include a chassis 206 within which are housed electronics and liquid cooling components 208. Rack 500 can also include an optional fan unit 214 in a fan region between partitions 204a and 204b.

The primary difference between rack 500 and racks 200, 300, and 400 is the motion of the cooling door. Rack 500 includes a cooling door 502 positioned at the back of the enclosure, and the cooling door can move between a first (closed) position across the rear of the enclosure (FIG. 5A) to a second (open) position where it projects from the side of the enclosure (FIG. 5B). Cooling door 502 includes one or more rails 504 that slide through a guide 506, so that instead of rotating between its first and second positions about a hinge, cooling door 502 slides between the first and second positions through guide 506 along rails 504. In one embodiment cooling door 502 can have a construction substantially as shown in FIG. 2C, with the hinges replaced by rails at the top and/or bottom of the door. Connections between liquid-cooled IT equipment in the partitions can be made using flexible hoses in on example. Because there are fluid connections between the cooling door and the liquid cooling components inside the enclosure, either through a distribution manifold or not, corresponding flexible hoses should be sufficient long enough to support moving cooling door 502 from one position to another. Other type of design can also be used in other embodiments. Other embodiments of rack 500 can include multiple cooling doors, analogously to racks 200, 300, or 400, and rack 500 has all the same operating modes as racks 200, 300, and 400.

Figure 6:
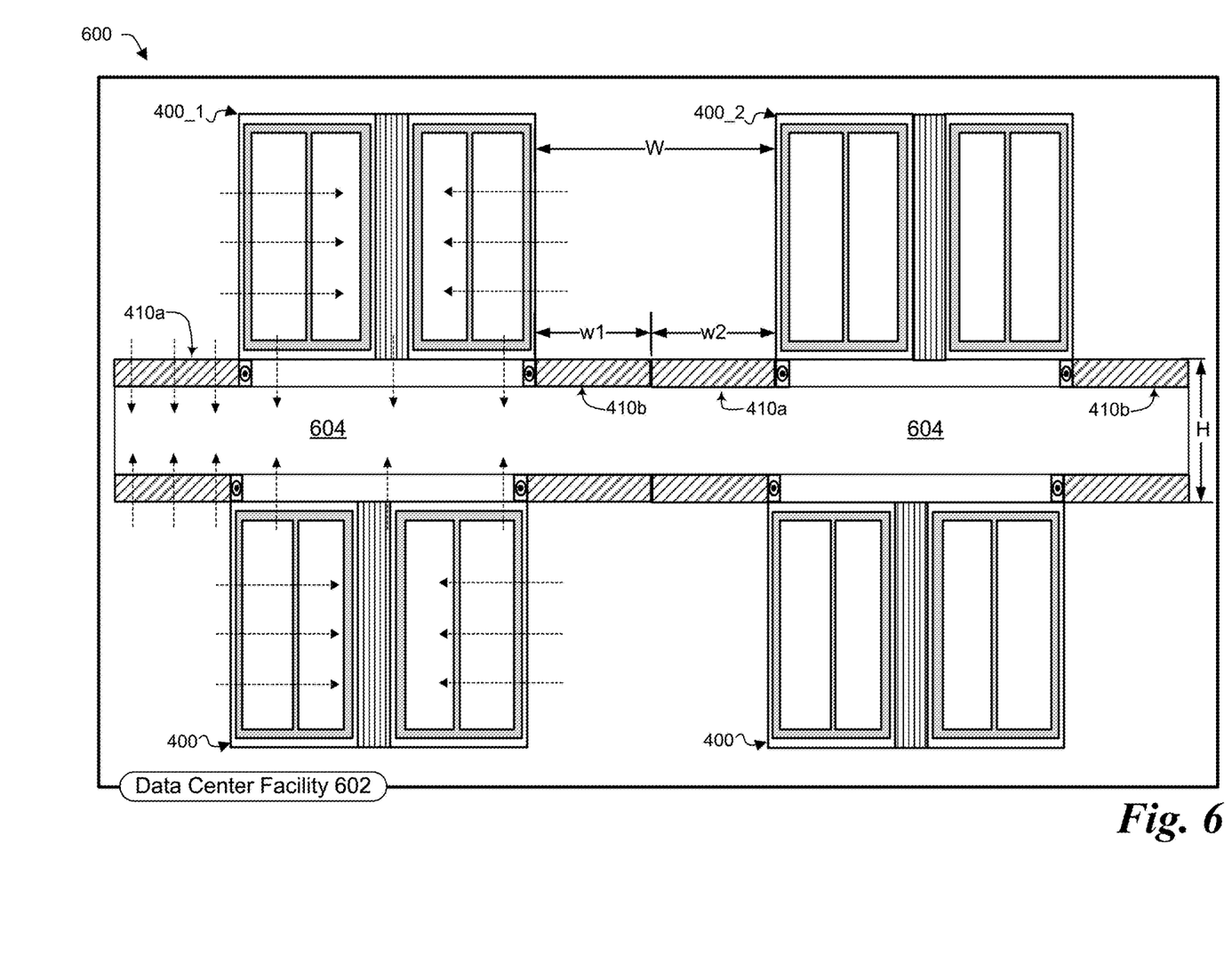
FIG. 6 is a plan view of an embodiment of a data center using IT racks with cooling doors.

FIG. 6 illustrates an embodiment of a data center 600. Data center 600 includes a data center facility 602. Although not shown in the drawing, data center 600 can include an air cooling system coupled to data center facility 602 to control the air flow and air temperature within the facility. A plurality of IT racks is positioned within data center facility 602, arranged in at least one row. The illustrated embodiment of data center 600 has two rows, each with two racks, but other embodiments can have a different number of rows than shown and each row can have a different number of racks than shown. In the illustrated embodiment, the racks are all IT racks 400 (see FIG. 4), but other embodiments of data center 600 can use other rack embodiments such as racks 200, 300, or 500. In still other embodiments, all racks in the row need not be the same type of rack. The airflow through each rack during operation is illustrated by the dashed arrows on the two leftmost racks in the figure.

In data center 600, the racks within each row are spaced apart from each other. The spacing between racks is adjusted to accommodate the combined widths of cooling doors on neighboring racks—i.e., the widths of cooling doors on each rack closest to the cooling door of the neighboring rack. In the top row in the figure, for instance, each rack 400_1 and 400_2 has a pair of cooling doors 410a and 410b. Racks 400_1 and 400_2 are spaced apart by a distance W, which is substantially the sum of the distance w1 by which cooling door 410b of rack 400_1 projects from the side of rack 400_1 and the distance w2 by which cooling door 410a of rack 400_2 projects from the side of rack 400_2. In other words, W≅w1+w2. In the illustrated embodiment, width W is selected so that the side of each cooling door abuts or nearly abuts the side of the neighboring cooling door—e.g., cooling door 410b of rack 400_1 abuts cooling door 410a of rack 400_2—to create containment region 604. But in other embodiments the spacing between racks can be different and the cooling doors need not abut. In the illustrated embodiment every rack has both its cooling doors in their second position with β=180 degrees. By spacing the IT racks in each row as described above, the equipment enclosures 400 and their cooling doors 410 form a containment region 604 between rows. Distance H between rows of racks can be selected to be large enough to accommodate the rotation of the cooling doors about their hinges.

In operation, cool air from the data center facility 602 flows through each enclosure and partition, and through each cooling door, removing heat from the electronics within each enclosure, as illustrated by the dashed arrows in the figure. Hot air exiting from the interiors of the equipment enclosures and from the heat exchangers in each cooling door flows into containment region 604, from which it can then be directed to the facility's climate control equipment to be exhausted from the facility or cooled and reintroduced into the facility as new cooling air. Containment region 604, then, functions as a hot aisle in a hot aisle/cold aisle arrangement which is used to contain the airflow and separate the airflow for the room for two regions. The cooling airflow is separated and used for cooling the racks and the cooling doors separately and simultaneously, so that the cooling doors function as heat expansion units that use the fluid circulating within the closed loop to transferring some portion of the heat within the IT and rack to the cooling door. Therefore, the heat transfer area between the heat load and the cooling air is increased significantly and the facility airflow can be used more efficiently. This can also be understood as increasing the rack density in a single rack, however, while using the cooling door to separate the heat or expand the heat exchange area for better thermal management.

Figure 7:
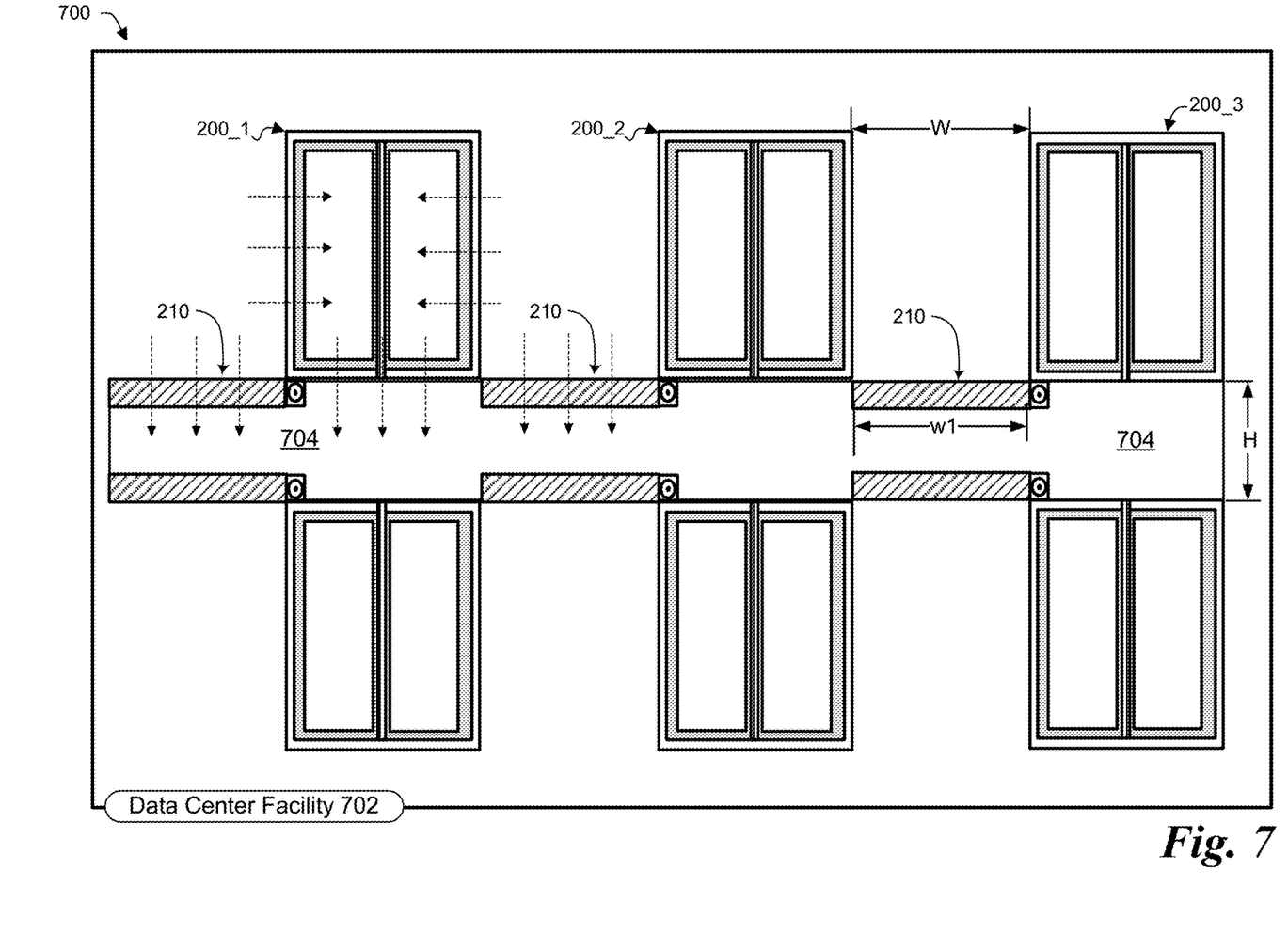
FIG. 7 is a plan view of another embodiment of a data center using IT racks with cooling doors.

FIG. 7. illustrates an embodiment of a data center 700. Data center 700 is in most respects similar to data center 600: it includes a data center facility 702 and, although not shown in the drawing, it can include an air cooling system coupled to data center facility 702 to control the air flow and air temperature within the facility. Data center 700 can also include a liquid cooling system to circulate cooling fluid through the individual racks and their cooling doors. A plurality of IT racks is positioned within data center facility 702, arranged in at least one row. The illustrated embodiment of data center 700 has two rows, each with three racks, but other embodiments can have a different number of rows than shown and each row can have a different number of racks than shown. In the illustrated embodiment, the racks are all IT racks 200 (see FIG. 2), but other embodiments of data center 700 can use other IT rack embodiments such as racks 300, 400, or 500. In still other embodiments, all racks in the row need not be the same type of rack. The airflow through each rack during operation is illustrated by the dashed arrows on rack 200_1 in the figure.

In data center 700, the racks within each row are spaced apart from each other. The spacing between racks is adjusted to accommodate the widths of the cooling doors on each rack. In the top row in the figure, for instance, racks 200_1 through 200_3 each have a cooling door 210. As illustrated by racks 200_2 and 200_3, racks in each row are spaced apart by a distance W, which is substantially the width w1 by which cooling door 210 of rack 200_3 projects from the side of rack 200_3. In other words, W≅w1. With this spacing, each cooling door abuts or nearly abuts the neighboring rack. Distance H between rows of racks can be selected to be large enough to accommodate the rotation of cooling doors 210 about their hinges. In the illustrated embodiment every rack has both its cooling doors 210 in their second position with β=180 degrees. By spacing the IT racks in each row as described above, the equipment enclosures 200 and their cooling doors 210 form a containment region 704 between rows, similar to data center 600.

Operation of data center 700 is similar to operation of data center 600. Cool air from the data center facility 702 flows through each enclosure and partition and through each cooling door, removing heat from the electronics within each enclosure, as illustrated by the dashed arrows in the figure. Hot air exiting from the interiors of the equipment enclosures and from the heat exchangers in each cooling door flows into containment region 704, from which it can then be directed to the facility's climate control equipment for cooling and possible reintroduction into the facility as new cooling air. Containment region 704 functions as a hot aisle in a hot aisle/cold aisle arrangement. Both FIG. 6 and FIG. 7 show hot aisle containment, but different containment solutions may can be coupled in actual use.

Figure 8:
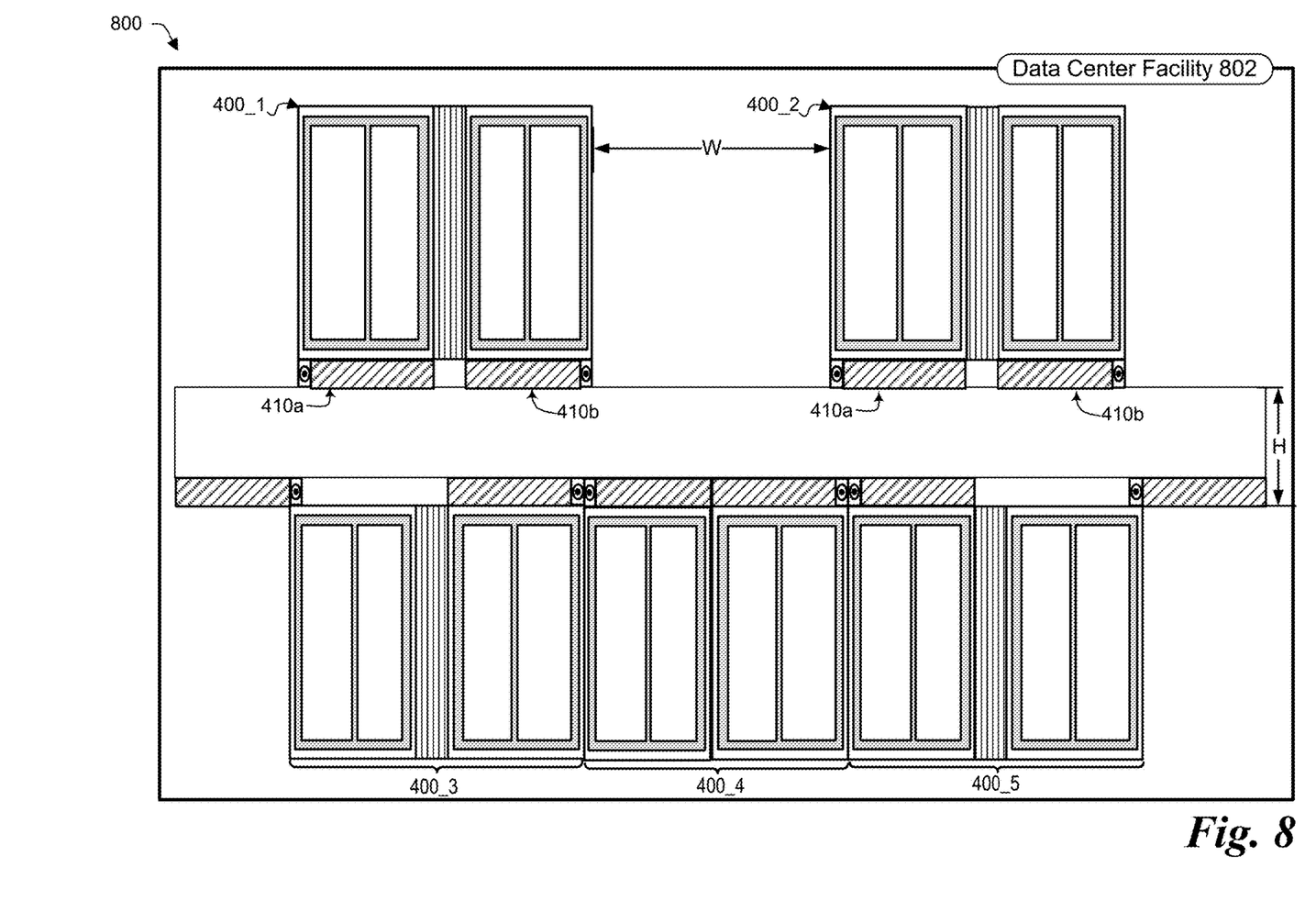
FIG. 8 is a plan view of another embodiment of a data center using IT racks with cooling doors.

FIG. 8. illustrates an embodiment of a data center 800. Data center 800 is in most respects similar to data centers 600 and 700: it includes a data center facility 802 and, although not shown in the drawing, can include an air cooling system coupled to data center facility 802 to control the air flow and air temperature within the facility. Data center 800 can also include a liquid cooling system to circulate cooling fluid through the individual racks and their cooling doors. A plurality of IT racks is positioned within data center facility 802, arranged in at least one row. The illustrated embodiment of data center 800 has two rows, each with two racks, but other embodiments can have a different number of rows than shown and each row can have a different number of racks than shown. In the illustrated embodiment, the racks are all IT racks 400 (see FIG. 4), but other embodiments of data center 700 can use other rack embodiments such as racks 200, 300, or 500. In still other embodiments, all racks in the row need not be the same type of rack.

Data center 800 illustrates the deployment flexibility of the IT racks described above. Each racks can be operated with a different cooling door configuration than previously described, and all racks need not operate with the same cooling door configuration. In the top row in the figure, for instance, each rack 400_1 and 400_2 has a pair of cooling doors 410a and 410b. Racks 400_1 and 400_2 are spaced apart by a distance W, as described above for FIG. 6, to allow for movement of the cooling doors 410 to their second (open) position. But despite being placed relative to each other to accommodate the second (open) positions of their cooling doors with β=180 degrees, rack 400_1 and 400_2 both keeps their cooling doors in their first (closed) position with β=0 degrees. Racks in a row can also be operated with some cooling doors in their closed position and some in their open position. For instance, as shown in the bottom row in the figure, racks 400_3 and 400_5 each have one door in the closed position and one door in the open position with β=80 degrees, while rack 400_4 keeps both its cooling doors in their closed position with β=0 degrees. Rack 400_4 also omits the fan unit, illustrating that it can be used or omitted as necessary to tailor the heat transfer from each rack or to tailor the spacing between racks. The fan unit used in 400_3 is dedicated for the rack on its left, while the fan unit in 400_5 is dedicated for the rack on its right.

Figure 9:
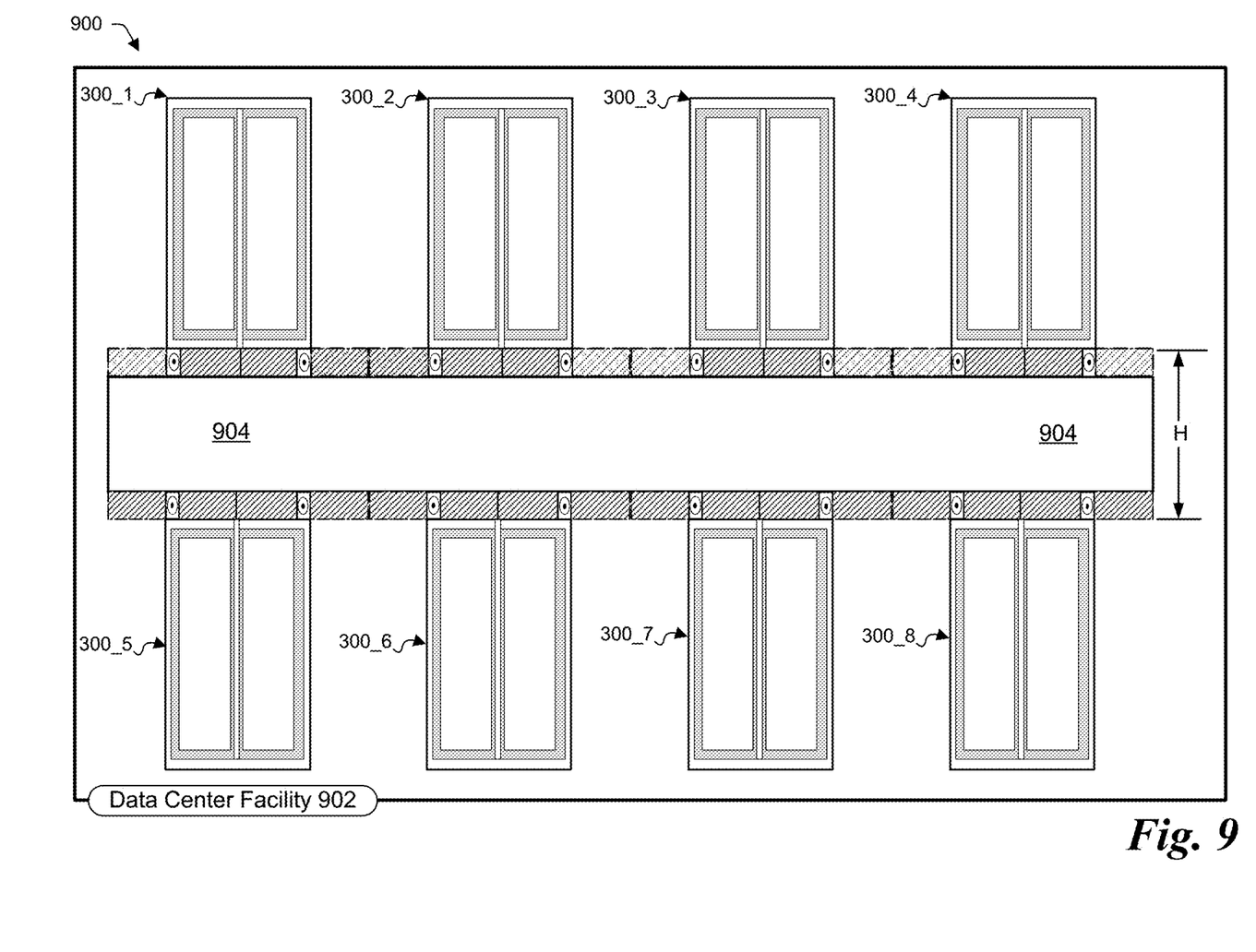
FIG. 9 is a plan view of another embodiment of a data center using IT racks with cooling doors.

FIG. 9 illustrates an embodiment of a data center 900. Data center 900 is in most respects similar to data centers 600, 700, and 800: it includes a data center facility 902 and, although not shown in the drawing, can include an air cooling system coupled to data center facility 902 to control the air flow and air temperature within the facility. Data center 900 can also include a liquid cooling system to circulate cooling fluid through the individual racks and their cooling doors. A plurality of IT racks is positioned within data center facility 902, arranged in at least one row. The illustrated embodiment of data center 900 has two rows, each with four racks, but other embodiments can have a different number of rows than shown and each row can have a different number of racks than shown. In the illustrated embodiment, the racks are all IT racks 300 (see FIGS. 3A-3B), but other embodiments of data center 900 can use other rack embodiments such as racks 200, 300, or 500. In still other embodiments, all racks in the row need not be the same type of rack. In the figure, cooling doors are illustrated in their closed positions (solid outline) and open positions (dashed outline), but in any given configuration each cooling door will either be open or closed.

Data center 900 again illustrates the deployment flexibility of the IT racks described above. When the dimension H of containment area/hot aisle 904 is a limitation, a rack such as rack 300 with two cooling doors can be a better option. Using two cooling doors may provide more cooling flexibilities on the rack power density non-uniform management. The cooling doors are presented in solid lines in their closed position (β=0), and in dashes lines in their open position (β=180 in this embodiment). The spacing between rack is as describe above for data center 600, so that when all cooling doors are in their open position they abut or nearly abut so that the cooling doors and enclosures create a containment area/hot aisle containment 904.

In a data center that is purely air cooled, high-density racks are hybrid cooled using air and liquid: liquid carrying heat load is recirculated to the cooling door, and the door is cooled using facility airflow. If the rack itself is only air cooled, then there are two possibilities. First, the cooling door can be used closed but fluidly coupled to an external data center cooling fluid loop if available, in which case the cooling door functions as a rear door heat exchanger. This is being operated as hybrid cooled system with the IT rack being air cooled. Second, the cooling door can be used open but with a blanking panel, in which case facility airflow is used only for cooling the racks directly.

As previously mentioned, the lifetime of the data center and IT equipment are different. For example, consider an air-cooled data center built for 160 kW. If the power rating for each first generation IT and rack configuration is 10 kW, then the two rows shown in FIG. 9 can be populated with 16 racks perfectly. But if in the second generation rack power goes up to 20 kW, embodiment of the described IT rack can deploy eight 20 kW racks and at the same time use the cooling system in a most efficient manner. Therefore, the described rack embodiments provide a highly flexible platform for server deployments in data centers.

Other embodiments of the described IT racks and data centers are possible besides the ones described above. For instance:

The internal system design, such as the heat exchanger, pumping system and the individual liquid cooling loop for each node may be different.

The solution can be used in either an air cooling data center or liquid cooling data centers; in a liquid cooling data center, cooling fluid is supplied to the rack or the cooling door; therefore, the deployment method and rack internal loop design may be different.

Additional fan systems or structural may be used for airflow management and better efficiency.

The above description of embodiments is not intended to be exhaustive or to limit the invention to the described forms. Specific embodiments of, and examples for, the invention are described herein for illustrative purposes, but various modifications are possible.

What is claimed is:

1. An information technology (IT) rack comprising:
an equipment enclosure including a front, a rear, and one or more partitions, the one or more partitions adapted to receive liquid-cooled information technology (IT) equipment; and
at least one cooling door positioned on the rear of the equipment enclosure, the at least one cooling door having therein a heat exchanger, the heat exchanger being fluidly coupled to a liquid cooling system of at least one of one or more pieces of the liquid-cooled IT equipment;
wherein the at least one cooling door is movable between:
a first position where the cooling door extends across a rear of at least one partition so that air from an interior of the at least one partition flows through the cooling door, and
a second position where air from outside the equipment enclosure flows through the cooling door;
wherein the IT rack further includes at least one additional equipment enclosure and a fan region positioned between at least one pair of equipment enclosures, the fan region adapted to receive one or more fan units to entrain air from the at least one pair of equipment enclosures and exhaust the air from a rear of the fan region.

2. The IT rack of claim 1 wherein the equipment enclosure is an IT rack vertically separated into two partitions.

3. The IT rack of claim 1 wherein the equipment enclosure comprises a pair of individual IT racks, each individual IT rack forming a partition.

4. The IT rack of claim 1 wherein the at least one cooling door extends across a single partition.

5. The IT rack of claim 1 wherein the at least one cooling door extends across multiple partitions.

6. The IT rack of claim 1, wherein the equipment enclosure includes two or more partitions, and further comprising a fan region positioned between at least one pair of partitions, the fan region adapted to receive one or more fan units to entrain air from the two or more partitions and from one or more sides of the rack and exhaust the air from the rear of the fan region.

7. The IT rack of claim 1 wherein the at least one cooling door is coupled to the rear of the equipment enclosure by a hinge and wherein the at least one cooling door moves between its first position and its second position by rotating about the hinge.

8. The IT rack of claim 7 wherein the fluid coupling between the heat exchanger in each cooling door and its corresponding IT equipment is routed through the hinge.

9. A data center comprising:
- a data center facility;
- a plurality of information technology (IT) racks positioned in one or more rows in the data center facility, each IT rack including:
- an equipment enclosure including a front, a rear, and two or more partitions, each partition adapted to receive a piece of liquid-cooled information technology (IT) equipment, and
- at least one cooling door positioned on the rear of the equipment enclosure, the at least one cooling door having therein a heat exchanger, the heat exchanger being fluidly coupled to a liquid cooling system of at least one of one or more pieces of the liquid-cooled IT equipment,
- wherein the at least one cooling door is movable between:
- a first position where the cooling door extends across the rear of at least one partition so that air from an interior of the at least one partition flows through the cooling door, and
- a second position where air from outside the equipment enclosure flows through the cooling door; and
- wherein the IT rack further includes at least one additional equipment enclosure and a fan region positioned between at least one pair of equipment enclosures, the fan region adapted to receive one or more fan units to entrain air from the at least one pair of equipment enclosures and exhaust the air from a rear of the fan region.

10. The data center of claim 9 wherein in at least one IT rack the equipment enclosure is an IT rack vertically separated into two partitions.

11. The data center of claim 9 wherein in at least one IT rack the equipment enclosure comprises a pair of individual IT racks, each individual IT rack forming a partition.

12. The data center of claim 9 wherein at least one IT rack further comprises a radial fan unit positioned between at least one pair of partitions and adapted to entrain air from the at least one pair of partitions and exhaust the air from the rear of the equipment enclosure.

13. The data center of claim 9 wherein in at least one IT rack the at least one cooling door is coupled to the rear of the equipment enclosure by hinges and wherein each cooling door moves between its first position and its second position by rotating about the hinges.

14. The data center of claim 13 wherein the fluid coupling between the heat exchanger in the at least one cooling door and its corresponding IT equipment is routed through at least one of the hinges.

15. The data center of claim 9 wherein at least two IT racks in a row are separated from each other by a combined width of the cooling doors hinged on sides of the equipment enclosures closest to each other.

16. The data center of claim 9 wherein the one or more rows of IT racks include a first row and a second row, the rear of each IT rack in the first row facing the rear of each IT rack in the second row.

17. The data center of claim 16 wherein each IT rack in the first row and each IT rack in the second row have their cooling doors in the second position, so that the cooling door of one IT rack abuts the cooling door of a neighboring IT rack and the cooling doors and enclosures form a hot aisle.

18. The data center of claim 9 wherein every IT rack has a single cooling door that extends across all partitions in the equipment enclosure when in the first position.

19. The data center of claim 9 wherein every IT rack has a pair of cooling doors, each of which extends across one or more partitions of the equipment enclosure when in the first position.

* * * * *